United States Patent
Pelley, III et al.

(10) Patent No.: US 7,990,795 B2
(45) Date of Patent: Aug. 2, 2011

(54) DYNAMIC RANDOM ACCESS MEMORY (DRAM) REFRESH

(75) Inventors: Perry H. Pelley, III, Austin, TX (US); George P. Hoekstra, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 90 days.

(21) Appl. No.: 12/388,922

(22) Filed: Feb. 19, 2009

(65) Prior Publication Data
US 2010/0208537 A1    Aug. 19, 2010

(51) Int. Cl.
*G11C 7/00* (2006.01)
(52) U.S. Cl. .......................... 365/222; 365/201; 365/236
(58) Field of Classification Search .................. 365/222, 365/201, 236
See application file for complete search history.

(56) References Cited

U.S. PATENT DOCUMENTS

| | | | |
|---|---|---|---|
| 5,148,546 A * | 9/1992 | Blodgett | 713/320 |
| 5,875,143 A | 2/1999 | Ben-Zvi | |
| 6,853,591 B2 * | 2/2005 | Schreck | 365/189.07 |
| 6,934,199 B2 * | 8/2005 | Johnson et al. | 365/194 |
| 6,965,537 B1 * | 11/2005 | Klein et al. | 365/222 |
| 7,088,633 B2 * | 8/2006 | Remaklus et al. | 365/222 |
| 7,099,221 B2 * | 8/2006 | Klein | 365/222 |
| 7,116,602 B2 * | 10/2006 | Klein | 365/222 |
| 7,184,350 B2 * | 2/2007 | Remaklus et al. | 365/222 |
| 7,444,577 B2 * | 10/2008 | Best et al. | 714/745 |
| 7,565,479 B2 * | 7/2009 | Best et al. | 711/106 |
| 2003/0193829 A1 | 10/2003 | Morgan et al. | |
| 2004/0042304 A1 | 3/2004 | Kirsch | |
| 2004/0196718 A1 | 10/2004 | Poechmueller | |
| 2006/0120193 A1 | 6/2006 | Casper | |

OTHER PUBLICATIONS

PCT Application No. PCT/US2010/021766 Search Report and Written Opinion Mailed May 4, 2010.

* cited by examiner

*Primary Examiner* — Viet Q Nguyen
(74) *Attorney, Agent, or Firm* — James L. Clingan, Jr.; Joanna G. Chiu

(57) ABSTRACT

A method for refreshing a Dynamic Random Access Memory (DRAM) includes performing a refresh on at least a portion of the DRAM at a first refresh rate, and performing a refresh on a second portion of the DRAM at a second refresh rate. The second portion includes one or more rows of the DRAM which do not meet a data retention criteria at the first refresh rate, and the second refresh rate is greater than the first refresh rate.

8 Claims, 3 Drawing Sheets

DYNAMIC RANDOM ACCESS MEMORY (DRAM) REFRESH

BACKGROUND

1. Field

This disclosure relates to memories, and more particularly, to dynamic random access memory (DRAM) refresh.

2. Related Art

Dynamic random access memories (DRAMs) are particularly useful as memories because of their density and speed. One of the disadvantages of DRAMs is that they require refreshing in order to maintain the contents of the memory. Refreshing requires power which makes them somewhat less desirable for applications that are battery powered, especially hand held devices such as cell phones.

Thus there is a need for a reduction in the power consumption of DRAMs.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a memory has its refresh controlled so that refresh is performed at addresses that require a high frequency of refresh more often than those that require refresh less often. The result is that less power is consumed. This is better understood by reference to the following specification and the drawings.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Figure 1:
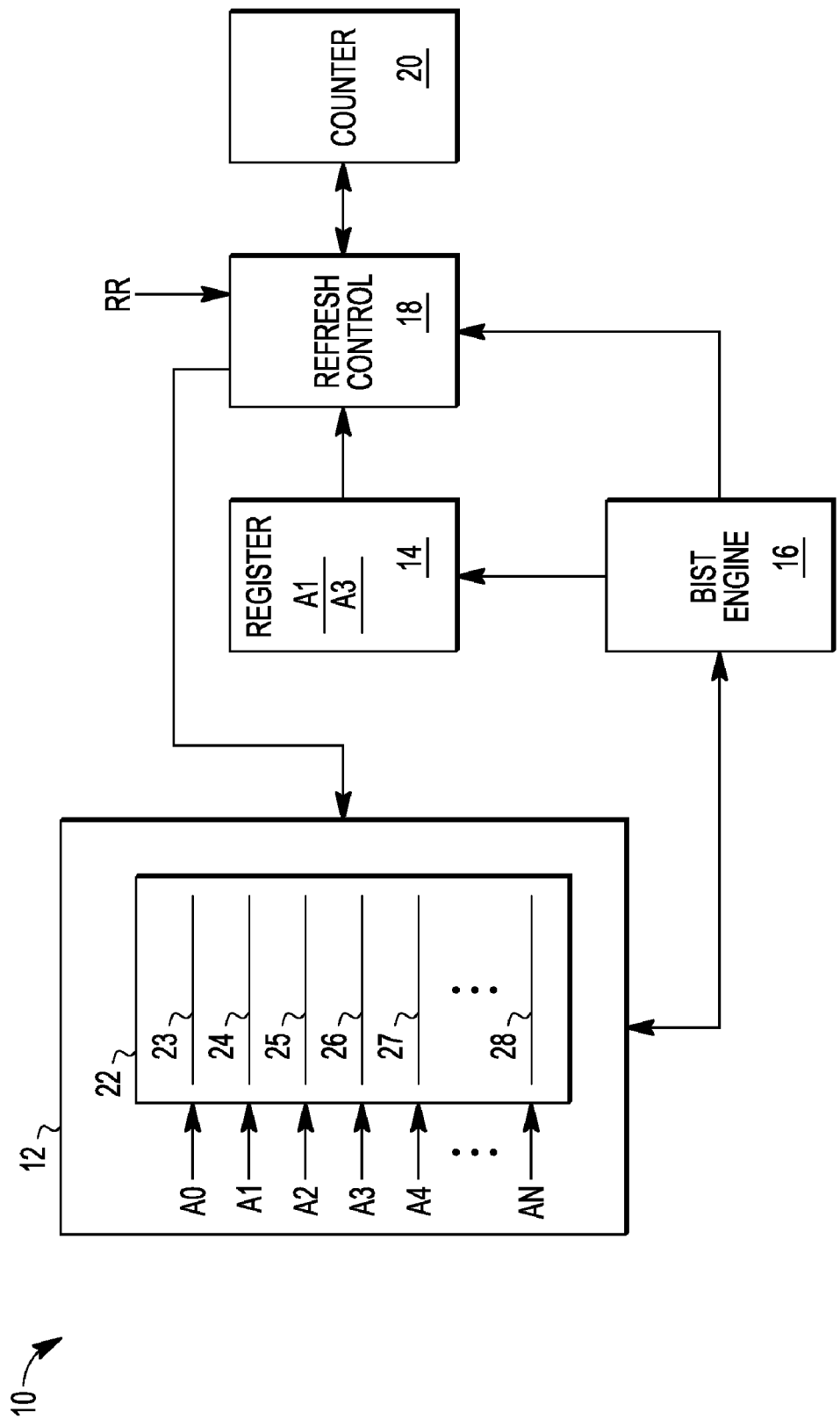
FIG. 1 is a block diagram of a system according to an embodiment.

Shown in FIG. 1 is a system 10 comprising a memory 12, a register 14, a built-in self test (BIST) engine 16, a refresh control circuit 18, and a counter 20. Memory 12 includes an array 22 of DRAM cells as well as peripheral circuitry for writing and sensing data in selected locations in array 22. DRAM cells are most commonly made up of a transistor and a capacitor, but other types of DRAMs cells may also be used such as transistors with nanocrystal storage that requires refresh due to the gate dielectric being very thin. Addresses A0, A1, A2, A3, A4, and AN are shown as corresponding to word lines 23, 24, 25, 26, 27, and 28 of array 22. Refresh of memory cells present in array 22 occurs by row. Memory 12 is coupled to refresh control circuit 18 and BIST engine 16. Register 14 is coupled to refresh control circuit 18 and BIST engine 16. Refresh control circuit 18 is coupled to counter 20 and receives a refresh request RR.

Figure 2:
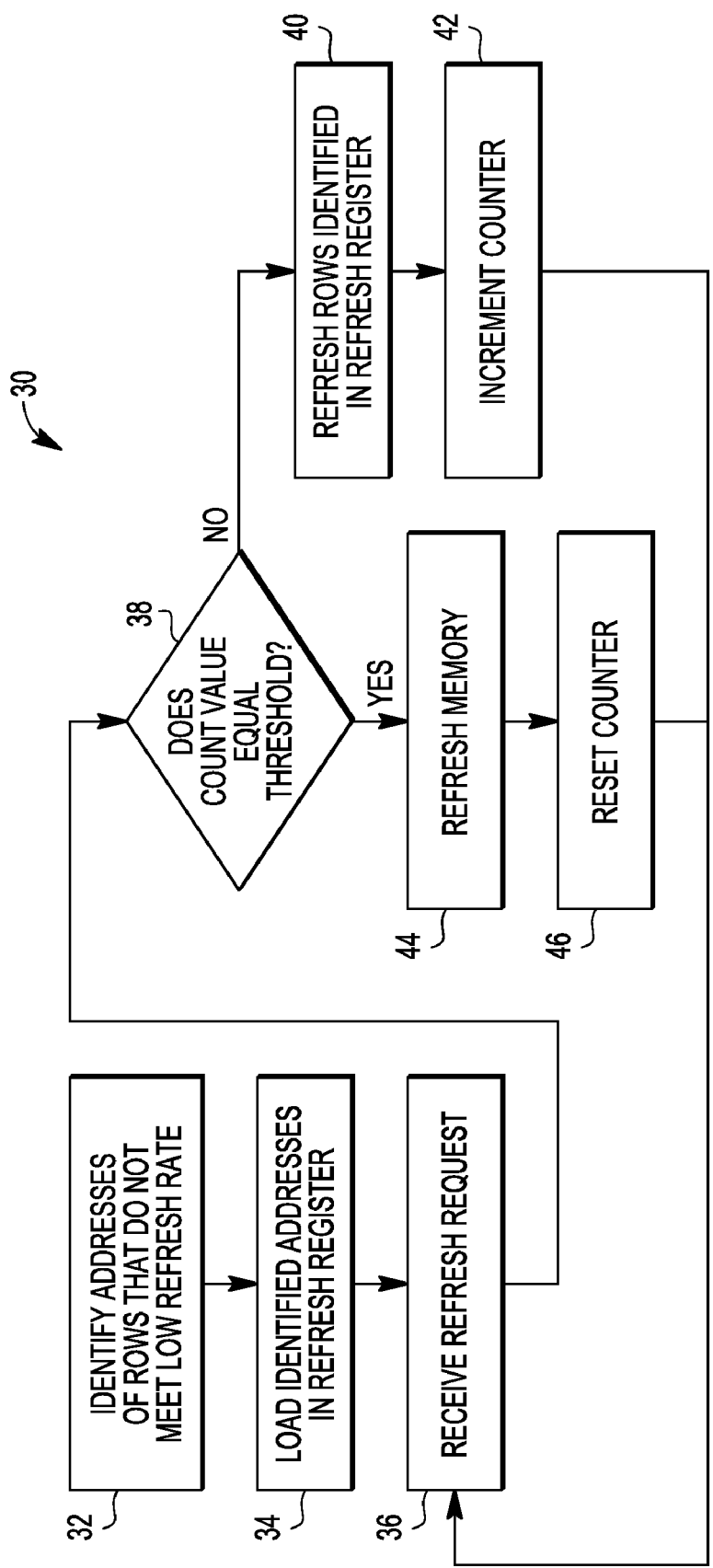
FIG. 2 is a flow diagram useful in understanding the operation of the system of FIG. 1.

Shown in FIG. 2 is a flow diagram 30 describing an operation of the system of FIG. 1.

Figure 3:
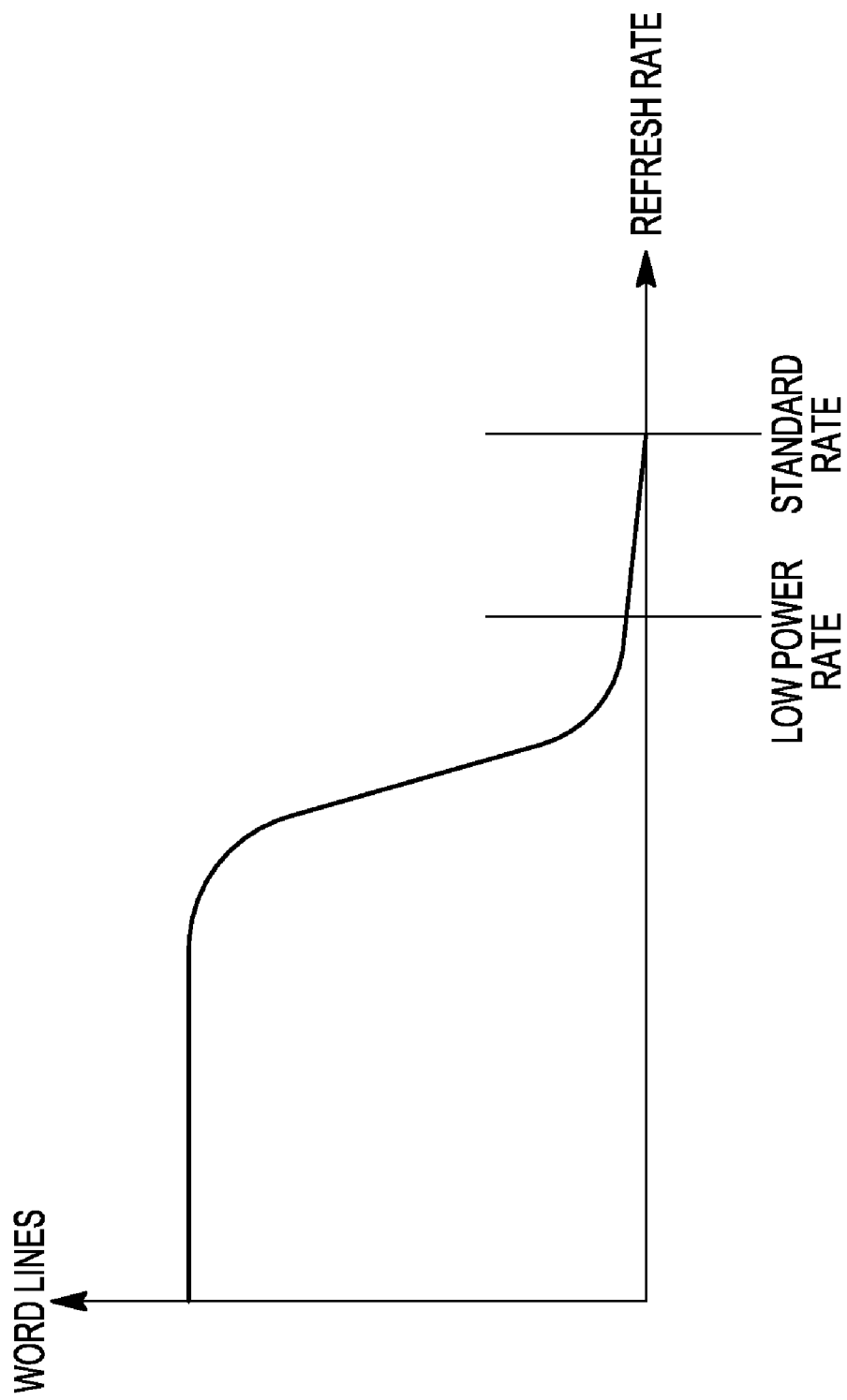
FIG. 3 is a graph helpful in understanding the operation of the system of FIG. 1.

Shown in FIG. 3 is a graph showing a distribution of word lines, which may also be called rows, based on refresh rate. A standard refresh rate is based on what is expected in the industry. This expectation is in turn based on the refresh rate at which all of memory cells of memory 12 can be refreshed and still have reasonable yields. A typical specification for refresh rate is 4 milliseconds. As shown in this graph, nearly all of the word lines can be refreshed at a slower rate than the standard rate. A slower rate, which is a low power rate, is selected at which nearly all of the cells can be refreshed. The word lines shown as being between the standard rate and the low power rate are refreshed at the standard rate. The word lines at or below the low power rate are refreshed at the low power rate to save power. This curve has been found to be very repeatable so that for a given process the number of word lines that require a refresh rate greater than the low power rate can, with a high degree of certainty not exceed a particular number. This low power rate can be considered to be a data retention criteria in which data retention is maintained at the lower refresh rate. A small percentage of the word lines fail to meet this data retention criteria but there are enough to make it impractical to not use those word lines and simply have a single refresh rate at the low power rate. The lower power rate can easily be 100 times less frequent than the standard rate. Thus, in this example, the low power rate can be once every 400 milliseconds. In a standby situation, this reduces the power of the DRAM by nearly 100 times.

In operation, register 14 is loaded with addresses of word lines that have memory cells that must be refreshed at a rate greater than a low power rate as shown in step 34 of FIG. 2. BIST engine 16 tests array 22 to identify the addresses of the word lines that do not have sufficient data retention at the low power rate as shown in step 32 of FIG. 2. For the case where word lines 24 and 26 are identified by BIST engine 16, BIST engine 16 loads addresses A1 and A3 into register 14. Steps 32 and 34 are done in preparation for refresh as well as other operations. Keeping in mind that memory 12 may be a separate integrated circuit within system 10, BIST engine 16 may perform steps 32 and 34 at start-up of memory 12 or in response to a command from another resource such as refresh control 18.

After register 14 has been loaded with addresses of word lines needing the more frequent refresh, refresh control circuit 18 receives a refresh request RR, which comes from a resource that may be within system 10 but not shown or outside of system 10 as shown in step 36. As shown in step 38, refresh control circuit 18 determines the state of counter 20. If counter 20 has reached a predetermined count, then all of the word lines of array 22 are refreshed as shown in step 44. If counter 20 has not reached the predetermined count, then only the word lines stored in register 14 are refreshed. In this example, the word lines identified by addresses A1 and A3 are refreshed. The number of word lines and thus the number of possible addresses can be quite large. A memory such as memory 12 may have a number of arrays each having large number of word lines. A number such as 1024 is not an uncommon number for the number of word lines in one array. This approach can be limited to a single array within a memory and thus the word lines of that single array or it can apply to all of the arrays and thus all of the word lines in the memory. In any case, the number of addresses store in register 14 is likely to be more than just the two such as addresses A1 and A3.

After performing the refresh of all of the word lines of array 22 or just the word lines stored in register 14 the counter is reset or incremented, and the refresh process continues responsive to subsequent refresh requests. One approach is for the predetermined number for the counter to be chosen when refresh controller circuit 18 and counter 20 are designed. Another is for the predetermined number be selected either in response to testing or other criteria. In either case, the predetermined number is the number of times the word lines having their addresses stored in register 14 are refreshed for each refresh of the whole array. Thus, for a case where the count is a 100, there will be one hundred refreshes for the word lines at the addresses stored in register 14 for each refresh of all of the word lines. Also the counter can be decremented as well as incremented and the reset may be as simple as rolling over the counter. The counter may also be very simple and refresh control circuit 18 may simply detect when the counter is at all zeros or all ones in order to perform the refresh of all of array 22.

Although BIST engine 16 is considered a desirable implementation, register 14, in the case of memory 12 being on the same integrated circuit as register 14, may be loaded with the addresses of the word lines that do not meet the data retention criteria at the low power rate of refresh at an earlier stage in testing. That is an external tester may perform the refresh testing and corresponding address identification for loading into register 14. Register 14, in such a case, may be implemented using a non-volatile memory. Register 14 may generally be implemented in a nonvolatile memory even if it is not loaded using an external tester. It may be beneficial to retain that information when power is lost. Also the determination of insufficient data retention to meet the low power rate may be achieved using an even slower refresh rate than the low power rate. This provides a margin for ensuring that all of the word lines that pass the low refresh rate test will also be able to meet the data retention criteria at the low power rate.

Two refresh rates were described for system 10, but even more refresh rates could be implemented. For example, in addition to the low power rate, an even lower refresh rate could additionally be used. In such case, a first group of word lines would be refreshed at the even lower refresh rate, a second group would be refreshed at the low power rate, and the third group would be refreshed at the standard rate. Assuming the low power rate was not changed, the addresses stored in register 14 would still be addresses A1 and A3 and would be the third group. Another register could store the addresses of the word lines refreshed at the low power rate, which is the second group, and all of the remaining word lines, which is the first group would be refreshed at the even lower refresh rate. When the first group is refreshed, the second and third groups would also be refreshed. Similarly, when the second group is refreshed, the third group would also be refreshed.

As an option, BIST 16 could determine the refresh rate for the low power rate. For example, it may be beneficial to reduce, within a safe margin, what is the lowest refresh rate for the low power rate. This could be done by determining the lowest refresh rate at which the number of word lines that do not meet the retention criteria at that refresh rate is not greater than the capacity of register 14. This refresh rate can be found by using successive approximation or a binary search or some other algorithm. As a variation on this approach, a very low refresh rate can be used for initially testing and if the number of word lines that do not meet the retention criteria is below the capacity of register 14, then use that refresh rate for the low power rate. If the capacity is exceeded, trying higher refresh rates until the register capacity is not exceeded.

By now it should be appreciated that there has been provided a method for refreshing a Dynamic Random Access Memory (DRAM). The method includes performing a refresh on a first portion of the DRAM at a first refresh rate. The method further includes performing a refresh on a second portion of the DRAM at a second refresh rate, the second portion including one or more rows of the DRAM which do not meet a data retention criteria at the first refresh rate, and wherein the second refresh rate is greater than the first refresh rate. The method may further comprise testing the DRAM to identify the one or more rows of the DRAM which do not meet the data retention criteria at the first refresh rate. The method may be further characterized by the testing being performed during power up of the DRAM. The method may further comprise performing a refresh on a third portion of the DRAM at a third refresh rate, wherein the third refresh rate is greater than second refresh rate. The method may be further characterized by the performing the refresh on the second portion of the DRAM at the second refresh rate being further characterized as performing the refresh on only the one or more rows included in the second portion of the DRAM at the second refresh rate.

Also disclosed is a system. The system includes storage circuitry which stores an address for each of one or more rows of a DRAM that do not meet a data retention criteria at a low power refresh rate, wherein the one or more rows of the DRAM do meet a data retention criteria at a standard refresh rate which is greater than the low power refresh rate. The system further includes a counter which counts received refresh requests for the DRAM. The system further includes refresh control circuitry coupled to the storage circuitry and the counter, wherein the refresh control circuitry, in response to a refresh request for the DRAM and based on a count value of the counter, performs a refresh of the DRAM or accesses the storage circuitry to perform a refresh of the one or more rows of the DRAM identified in the storage circuitry. The system may further include test circuitry which performs data retention testing on the DRAM to identify the one or more rows of the DRAM that do not meet the data retention criteria at the low power refresh rate. The system may be further characterized by the test circuitry being further characterized as built-in self test (BIST) circuitry. The system may be characterized by when the count value of the counter does not equal a threshold value, the refresh control circuitry accesses the storage circuitry to perform the refresh of the one or more rows of the DRAM identified in the storage circuitry. The system may be characterized by when the count value of the counter equals the threshold value, the refresh control circuitry performs the refresh of the DRAM, wherein the refresh of the DRAM includes refreshing the one or more rows of the DRAM identified in the storage circuitry as well as additional rows of the DRAM. The system may be characterized by when the count value of the counter equals the threshold value, the refresh control circuitry performs the refresh of the DRAM without accessing the storage circuitry. The system may be characterized by the threshold value being determined such that it corresponds to the low power refresh rate. The system may be characterized by when the refresh control circuitry, based on the count value, performs the refresh of the DRAM, the refresh control circuitry refreshes each active row of the DRAM. The system may be characterized by when the refresh control circuitry, based on the count value, performs the refresh of the DRAM, the refresh control circuitry performs the refresh of the DRAM without accessing the storage circuitry. The system may be characterized by when, based on the count value of the counter, the refresh control circuitry access the storage circuitry to perform the refresh of the one or more rows of the DRAM identified in the storage circuitry, the refresh control circuitry performs the refresh of only the one or more rows of the DRAM identified in the storage circuitry.

Described also is a method. The method includes providing an address for each of one or more rows of a DRAM that do not meet a data retention criteria at a low power refresh rate, wherein the one or more rows of the DRAM do meet a data retention criteria at a standard refresh rate which is greater than the low power refresh rate. The method also includes receiving a refresh request. The method also includes in response to receiving the refresh request, determining whether a full refresh or a partial refresh of the DRAM is to be performed, wherein the full refresh is performed at the low power refresh rate and the partial refresh is performed at the standard refresh rate. The method also includes in response to determining that a partial refresh is to be performed, using the provided address for each of the one or more rows of the DRAM that do not meet the data retention criteria at the low power refresh rate to perform a refresh of the one or more rows of the DRAM. The method also includes in response to determining that a full refresh is to be performed, refreshing the DRAM, wherein the refreshing the DRAM includes refreshing the one or more rows of the DRAM as well as additional rows of the DRAM. The method may include testing the DRAM to identify the one or more rows of the DRAM that do not meet the data retention criteria at the low power refresh rate. The method may be characterized by the testing being performed during power up. The method may be characterized by the refreshing the DRAM including refreshing each active row of the DRAM. The method may be characterized by the refreshing the one or more rows of the DRAM being further characterized as refreshing only the one or more rows of the DRAM.

Although the invention is described herein with reference to specific embodiments, various modifications and changes can be made without departing from the scope of the present invention as set forth in the claims below. For example, several options other than what was shown in the drawings were described. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A system comprising:
   storage circuitry which stores an address for each of one or more rows of a DRAM that do not meet a data retention criteria at a low power refresh rate, wherein the one or more rows of the DRAM do meet a data retention criteria at a standard refresh rate which is greater than the low power refresh rate;
   a counter which counts received refresh requests for the DRAM;
   refresh control circuitry coupled to the storage circuitry and the counter, wherein the refresh control circuitry, in response to a refresh request for the DRAM and based on a count value of the counter, performs a refresh of the DRAM or accesses the storage circuitry to perform a refresh of the one or more rows of the DRAM identified in the storage circuitry; and
   built-in self test (BIST) circuitry, which performs data retention testing on the DRAM to identify the one or more rows of the DRAM that do not meet the data retention criteria at the low power refresh rate, wherein the data retention testing is in response to start-up of the DRAM.

2. The system of claim 1, wherein when the count value of the counter does not equal a threshold value, the refresh control circuitry accesses the storage circuitry to perform the refresh of the one or more rows of the DRAM identified in the storage circuitry.

3. The system of claim 2, wherein when the count value of the counter equals the threshold value, the refresh control circuitry performs the refresh of the DRAM, wherein the refresh of the DRAM includes refreshing the one or more rows of the DRAM identified in the storage circuitry as well as additional rows of the DRAM.

4. The system of claim 3, wherein when the count value of the counter equals the threshold value, the refresh control circuitry performs the refresh of the DRAM without accessing the storage circuitry.

5. The system of claim 2, wherein the threshold value is determined such that it corresponds to the low power refresh rate.

6. The system of claim 1, wherein when the refresh control circuitry, based on the count value, performs the refresh of the DRAM, the refresh control circuitry refreshes each active row of the DRAM.

7. The system of claim 6, wherein when the refresh control circuitry, based on the count value, performs the refresh of the DRAM, the refresh control circuitry performs the refresh of the DRAM without accessing the storage circuitry.

8. The system of claim 1, wherein when, based on the count value of the counter, the refresh control circuitry access the storage circuitry to perform the refresh of the one or more rows of the DRAM identified in the storage circuitry, the refresh control circuitry performs the refresh of only the one or more rows of the DRAM identified in the storage circuitry.

\* \* \* \* \*